United States Patent
Yao et al.

(10) Patent No.: US 12,131,981 B2
(45) Date of Patent: Oct. 29, 2024

(54) POWER MODULE PACKAGE BASEPLATE WITH STEP RECESS DESIGN

(71) Applicant: SEMICONDUCTOR COMPONENTS INDUSTRIES, LLC, Scottsdale, AZ (US)

(72) Inventors: Yushuang Yao, Shenzhen (CN); Vemmond Jeng Hung Ng, Senawang (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/357,931

(22) Filed: Jul. 24, 2023

(65) Prior Publication Data
US 2023/0369176 A1    Nov. 16, 2023

Related U.S. Application Data

(63) Continuation of application No. 16/949,869, filed on Nov. 18, 2020, now Pat. No. 11,735,504.

(51) Int. Cl.
*H01L 23/492* (2006.01)
*H01L 21/48* (2006.01)

(52) U.S. Cl.
CPC ...... *H01L 23/4924* (2013.01); *H01L 21/4871* (2013.01)

(58) Field of Classification Search
CPC .................................................. H01L 23/4924
USPC ........................................................... 257/677
See application file for complete search history.

(56) References Cited

U.S. PATENT DOCUMENTS

| | | | |
|---|---|---|---|
| 2008/0315398 A1* | 12/2008 | Lo | H01L 23/5389 257/706 |
| 2010/0175756 A1* | 7/2010 | Weihs | C22C 21/00 156/60 |
| 2015/0294931 A1 | 10/2015 | Brucchi et al. | |
| 2017/0256682 A1 | 9/2017 | Kim et al. | |
| 2021/0391271 A1* | 12/2021 | Hsu | H01L 25/16 |

FOREIGN PATENT DOCUMENTS

| | | |
|---|---|---|
| DE | 102017106515 A1 | 9/2018 |
| JP | 2003017627 A | 1/2003 |
| JP | 2007220702 A | 8/2007 |
| JP | 2008218938 A | 9/2008 |

* cited by examiner

*Primary Examiner* — Ajay Arora
(74) *Attorney, Agent, or Firm* — Brake Hughes Bellermann LLP

(57) ABSTRACT

Implementations described herein are related to a semiconductor device package having an improved baseplate. In such an improved baseplate, there is a recess cut out of a region of a surface of the baseplate such that the recess has a first sidewall having a first thickness above a recess base and a second sidewall having a second thickness above the recess base. A substrate, e.g., a direct bonded copper (DBC) substrate, may be attached to the baseplate at a recess base using, e.g., a solder layer between the recess base and a surface of the substrate.

22 Claims, 6 Drawing Sheets

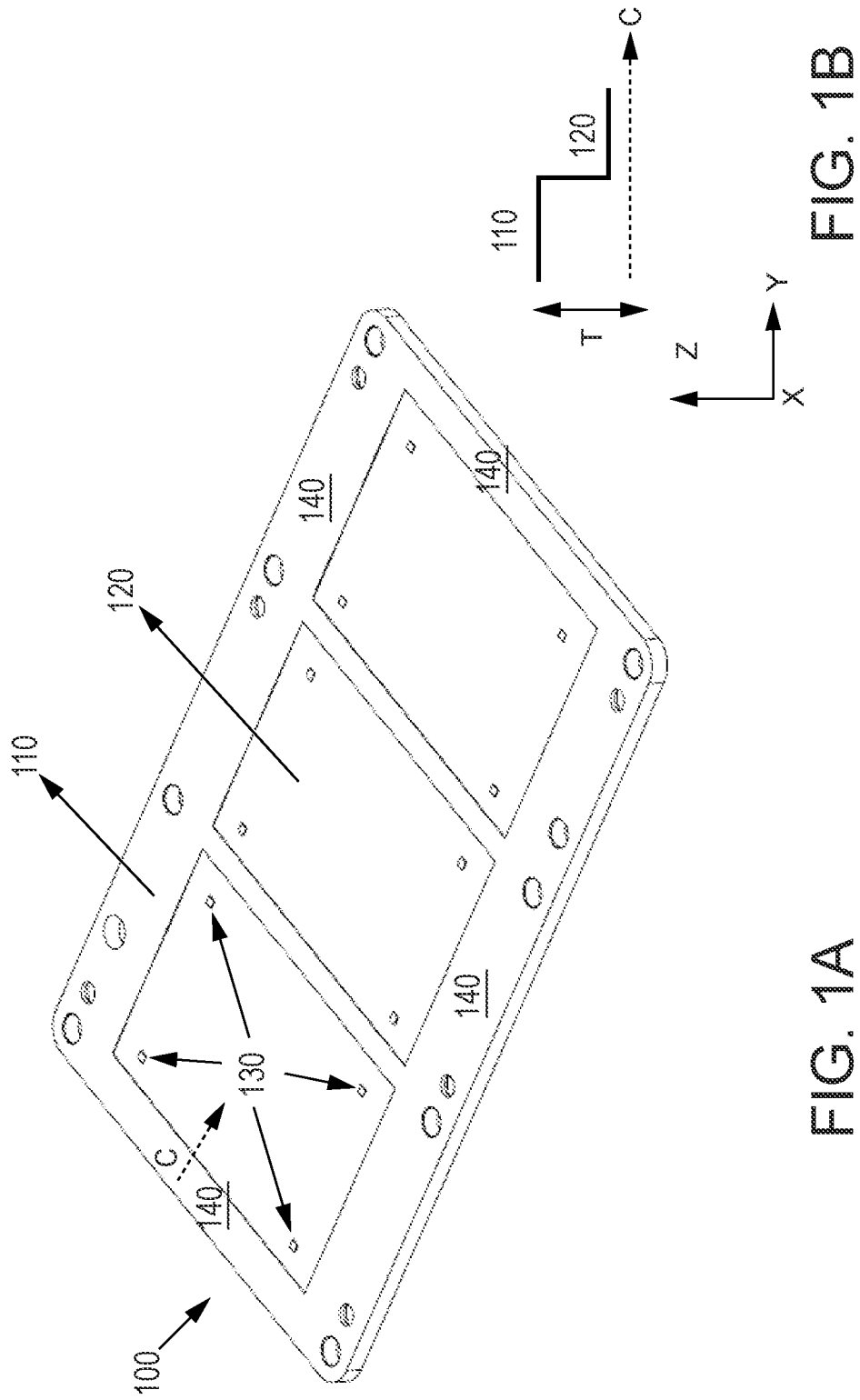

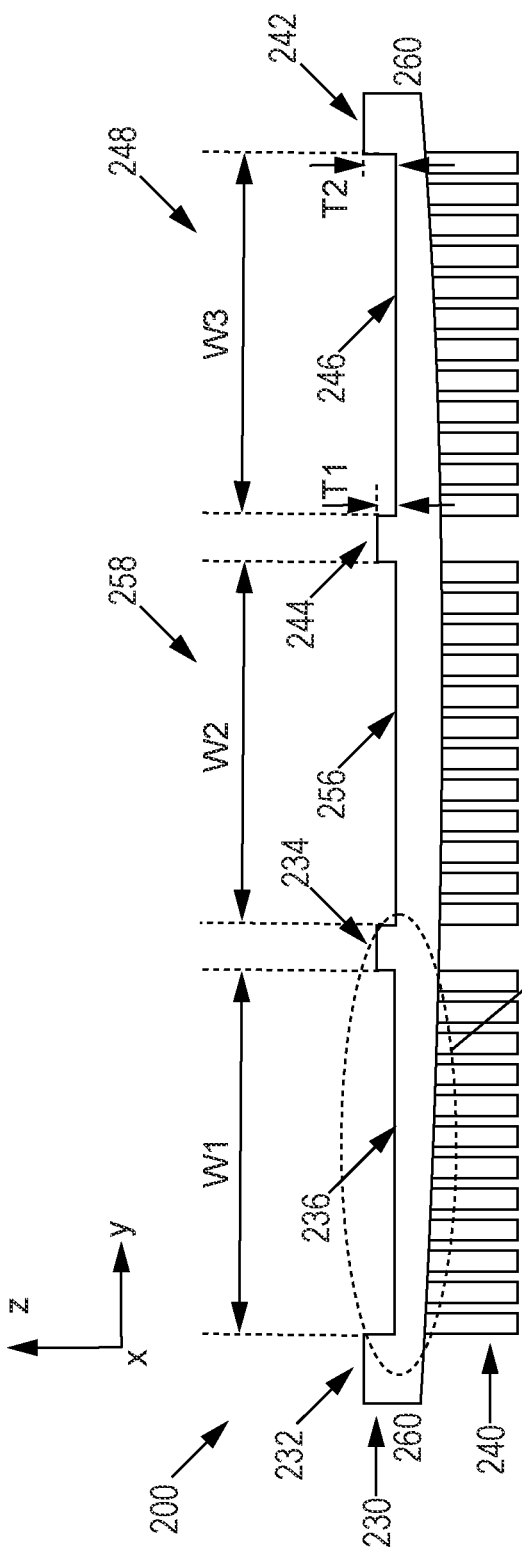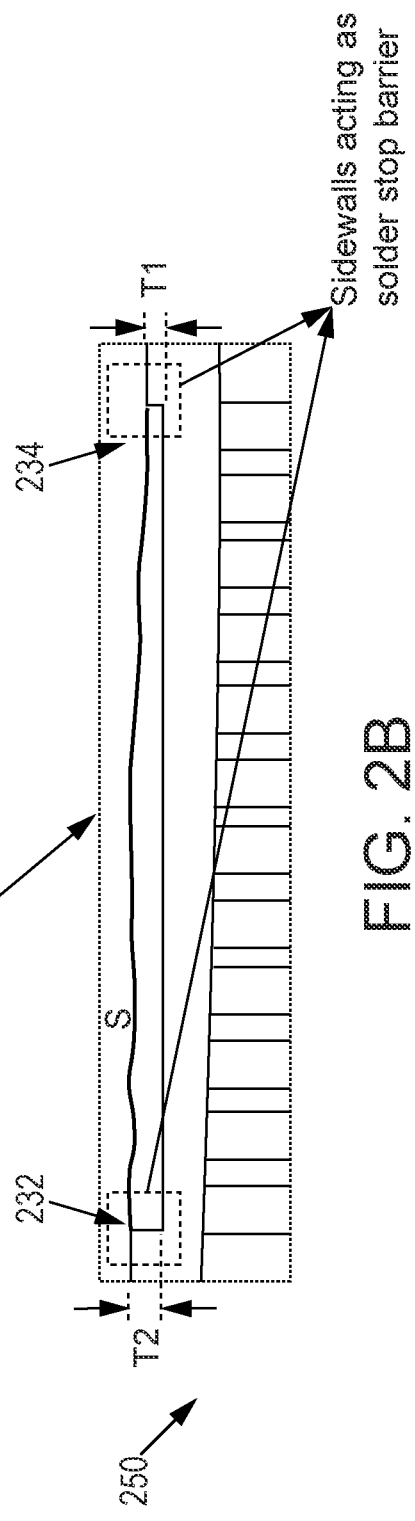
FIG. 2A
FIG. 2B

600

Performing a cutting operation on a surface of a baseplate to produce a set of grooves cut out of the first surface of the baseplate, each of the set of grooves including a respective groove base, a respective first sidewall, and a respective second sidewall, the respective first sidewall having a first thickness above the respective groove base and the respective second sidewall having a second thickness above the respective groove base 602

Receiving a substrate for a power module, the substrate including: a ceramic layer having a first side and a second side opposite the first side; and a first metal layer bonded to the first side of the ceramic layer 604

Attaching the substrate to the surface of the baseplate at a groove base of a groove of the set of grooves via a solder layer 606

FIG. 6

POWER MODULE PACKAGE BASEPLATE WITH STEP RECESS DESIGN

CROSS-REFERENCE TO RELATED APPLICATIONS

This application is a continuation of, and claims priority to, U.S. patent application Ser. No. 16/949,869, filed Nov. 18, 2020, entitled "POWER MODULE PACKAGE BASEPLATE WITH STEP RECESS DESIGN," the contents of which are incorporated by reference in their entirety.

TECHNICAL FIELD

This description relates to devices and methods for improving bond line thickness (BLT) uniformity during the attachment of a substrate to a baseplate in electronic power modules.

BACKGROUND

The role of a substrate in power electronics is to provide interconnections to form an electric circuit (e.g., a printed circuit board) and to cool its components. Such substrates usually carry higher currents and provide a higher voltage isolation than materials and techniques used in lower power microelectronics. Many substrates include a metal layer disposed on a dielectric layer. Some substrates have metal layers disposed on either surface of the dielectric layer.

SUMMARY

In one general aspect, a semiconductor device package can include a baseplate including a set of recesses cut out of a surface of the baseplate, each of the set of recesses including a respective recess base, a respective first sidewall, and a respective second sidewall. The semiconductor device package can also include a substrate. The substrate can include a dielectric layer, a first metal layer disposed on a first surface of the dielectric layer, and a second metal layer disposed on a second surface of the dielectric layer. The substrate can be attached to the first surface of the baseplate at a recess base of a recess of the set of recesses via a solder layer.

In another general aspect, a method can include performing a material removal operation on a baseplate at a region of a surface of the baseplate to produce a recess in the baseplate, the recess including a recess base, a first sidewall, and a second sidewall. The method can also include receiving a substrate. The substrate can include a dielectric layer, a first metal layer disposed on a first surface of the dielectric layer, and a second metal layer disposed on a second surface of the dielectric layer. The method can further include attaching the substrate to the first surface of the baseplate at a recess base of a recess of the set of recesses via a solder layer.

The details of one or more implementations are set forth in the accompanying drawings and the description below. Other features will be apparent from the description and drawings, and from the claims.

BRIEF DESCRIPTION OF THE DRAWINGS

FIG. 1A is a diagram that illustrates an isometric view of an example baseplate.

FIG. 1B is a diagram that illustrates a cross-section of the example baseplate.

FIG. 2A is a diagram that illustrates a side view of an example improved baseplate.

FIG. 2B is a diagram that illustrates a side view of an example recess of the improved baseplate.

FIG. 6 is a flow chart that illustrates an example method for attaching a substrate to a baseplate in a semiconductor device package according to improved techniques.

DETAILED DESCRIPTION

Figure 3A:
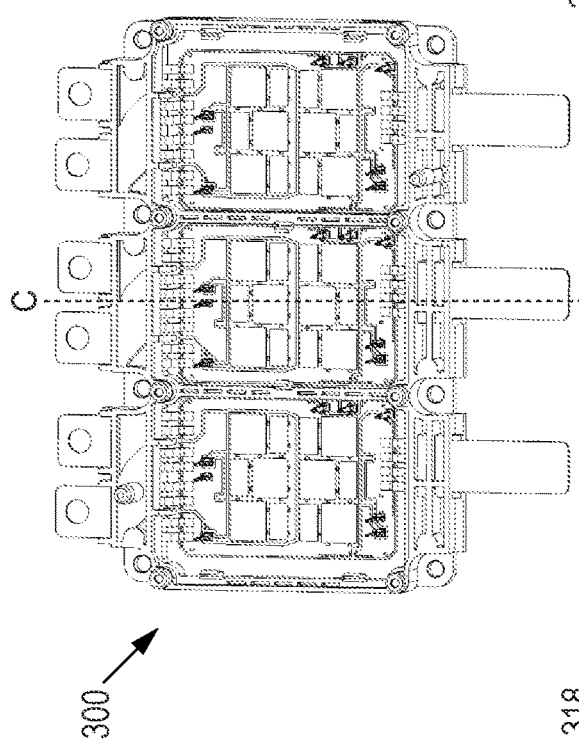
FIG. 3A is a diagram that illustrates a top view of an example single side direct cooling (SSDC) automotive power module package with cross-section.

One type of substrate that can be used in power modules are Direct Bonded Metal (DBM) substrates. One example of such a DBM substrate uses a dielectric such as an alumina dielectric. Accordingly, DBM substrate structures provide a wide temperature range for operation and electrical isolation in power packages as that described above. Moreover, some DBM substrates such as direct bonded copper (DBC) also have a low coefficient of thermal expansion (CTE). DBM substrates may have a metal layer on one or both sides of the dielectric. The metal may be bonded to one or both sides by a high-temperature oxidation process. The top metal layer can be etched using mechanical stamping, chemical etching, etc., to form an electrical circuit, while the bottom copper layer is usually unpatterned.

In many applications, as described herein a substrate is attached to a baseplate. The baseplate is made of one or more metals (e.g., aluminum, nickel, copper), provides pinfins for connections to external devices, and acts as a heat spreader to uniformly distribute thermal energy over the substrate. The substrate is attached to the baseplate via a conductive-bonding component such as solder, sinter, or the like.

Baseplates for certain applications (e.g., single side direct cooling (SSDC) automotive power module package) are flat surfaces of uniform metal attached to a substrate via a conductive-bonding component, e.g., solder. Maintaining a uniform planar bond line thickness (BLT) for the solder layer between such a baseplate and a DBM substrate may reduce the thermal and mechanical stress on the solder at a solder joint.

In some applications, the attachment of a substrate to a baseplate via a conductive-bonding component may cause negative warpage of the baseplate. Because such a conductive-bonding component may be in a liquid state during attachment, the liquid may then outflow toward the center of the baseplate, away from where it is needed. Moreover, poor surface wettability of the baseplate may cause large voids between the baseplate and the conductive-bonding component; this may lead to poor thermal transfer and possible overheating of any semiconductor dies disposed on the substrate. These problems may each cause a nonuniform BLT in the solder layer. When the stress is evaluated at a thinnest region of the solder, the evaluation may cause the conductive-bonding component to crack in the region. All of these issues may ultimately reduce yield. In applications such as automotive single side direct cooling (SSDC) where the baseplate is relatively large, these issues are magnified.

In contrast to the above-described baseplates, the implementations described herein are related to a semiconductor device package having an improved baseplate. In such an improved baseplate, there is material removed from a region on its surface to produce a recess. The recess has a first sidewall having a first thickness above a recess base and a second sidewall having a second thickness above the recess base. A substrate, e.g., a DBM substrate, may be attached to the baseplate at a recess base using, e.g., a solder layer between the recess base and a surface of the substrate.

In some implementations, the improved baseplate of the semiconductor package assembly can include a first metal and is plated at the surface of the baseplate with a second metal. In some implementations, the first metal includes copper. In some implementations, the second metal includes nickel. In some implementations, a surface of the recess base includes a surface of the second metal. In some implementations, a surface of the recess base includes a set of protruding dimples.

In some implementations, the set of recesses includes a recess having a recess base, a first sidewall having a first thickness above the recess base and a second sidewall having a second thickness above the recess base, the second sidewall being closer to an edge of the first surface of the baseplate than the first sidewall, the second thickness being greater than the first thickness. In some implementations, a difference between the second thickness and the first thickness is greater than about 0.1 mm. In some implementations, the first thickness is about 0.1 mm.

In some implementations, a width of a recess base of a recess of the set of recesses is greater than a width of the substrate.

In some implementations, a set of recesses are made via a material removal operation performed on the surface of the baseplate. In some implementations, performing the material removal operation includes polishing the second metal by which the surface of the baseplate is plated to reveal the first metal in the recess.

In some implementations, the substrate is attached to the first surface of the baseplate at a recess base of a recess of the set of recesses via a conductive-bonding component. In some implementations, attaching the substrate includes cleaning formic acid from the recess base of a recess of the set of recesses, and applying the conductive-bonding component to the recess base and the second metal layer of the substrate.

The improved baseplate of the semiconductor device package as described above is advantageous over conventional substrates. The recess remains flat with respect to the baseplate surface regardless of the warpage the baseplate experiences; in this way, the BLT is more likely to remain uniform. Moreover, the recess can act as a barrier to prevent outflow of the conductive-bonding component when attaching the substrate to the baseplate. Finally, the manufacture of the recess may lead to higher surface wettability and accordingly fewer voids. All of this may lead to higher yield.

FIG. 1A is a diagram that illustrates an isometric view of an example baseplate 100. The baseplate 100 acts as a heat spreader to uniformly distribute thermal energy over a substrate to which it is attached via a solder layer.

As shown in FIG. 1A, the baseplate 100 includes a first metal 120 and is plated in its surface with a second metal 110. In some implementations, the first metal 120 includes copper. In some implementations, the second metal 110 includes nickel.

To better visualize the recess, in the region occupied by the first metal 120, a cross section C is shown in FIG. 1B that traverses over a junction between the first metal 120 and the second metal 110.

FIG. 1B is a diagram that illustrates the cross-section C of the example baseplate. Also shown in FIG. 1B is a set of right-handed coordinate axes x, y, and z, with x pointing out of the drawing. As shown in FIG. 1B, in the z-direction there is a step of height T between the first metal 120 and the second metal 110 on the surface of the baseplate 100 along the y-axis. In some implementations, T is about 0.1 mm. This step is an edge of a recess in the surface of the baseplate 100. As shown in FIG. 1A, the recess also has a base which, in the example shown in FIG. 1A, includes the first metal 120. That is, the first metal 120 is exposed in the recess.

The recesses shown in FIG. 1A are produced via a material removal operation on the surface of the baseplate 100. For example, the material removal operation can include, in some implementations, a polishing operation on the second metal 110 that is plated over the first metal 120. The polishing operation, in some implementations, is performed using a polishing tool such as chemical-mechanical polishing (CMP). In some implementations, the polishing operation is carried out to a specified depth. In some implementations, the polishing operation is carried out until the first metal 120 has been exposed.

In some implementations, the recesses in the baseplate 100 do not reveal the first metal 120 but only show the second metal 110. In such an implementation, the second metal 120 may be placed in the recess via a plating and polishing process, e.g., to ensure planarization of the second metal 120 in the recess.

As also shown in FIG. 1A, the first metal 120 in each recess base includes a set of protruding dimples 130. The set of protruding dimples 130 may help reduce warpage of the baseplate 100 upon attachment of the baseplate 100 to a direct bonded metal (DBM) substrate (not shown). The baseplate 100 further includes, as shown in FIG. 1A, a perimeter 140.

FIG. 2A is a diagram that illustrates a cross-section of an example pin-fin baseplate assembly 200 and a set of right-handed coordinate axes x, y, and z as in FIG. 1B. As shown in FIG. 2A, the baseplate assembly 200 includes a baseplate 230 and a set of pins 240. The baseplate assembly 200 is a pin-fin baseplate assembly on an automotive SSDC; accordingly, the warpage on the bottom surface of the baseplate 230 is large and reflects the large baseplate 230 used for such an assembly.

As stated previously, negative warpage may be seen in such a baseplate during an attachment process with a substrate involving a conductive-bonding component such as solder. For example, with such a warpage, solder may outflow from a solder joint, i.e., a location at which the solder joins both the baseplate and a substrate (not shown). Because of the negative warpage of the baseplate, outflowing solder may flow toward a central region of the baseplate, potentially causing shorts in electrical connections located in the central region of the baseplate.

As shown in FIG. 2A, there is a set of recesses 238, 248, and 258 arranged across the baseplate 230 along the y-direction. For example, the baseplate 230 has a first recess having a base 236 of width W1 in the y-direction with sidewalls 232 and 234. Note that recess 236, as do recesses 248 and 258, extends along the x-direction. In some implementations, W1 is between about 1 mm-5 mm. As shown in FIG. 2A, the sidewall 232 is higher than the sidewall 234. That is, the thickness T2 of the sidewall 232 is greater than the thickness T1 of the sidewall 234.

FIG. 2B is a diagram that illustrates a cross-section view of recess 238 of the improved baseplate 230, but along another cross-section 250 along the x-direction at a perimeter 260 of the baseplate 230. Along the y-direction at the perimeter 260 of the baseplate is a sidewall S of the recess 238. In this case, because T2 is greater than T1, the sidewall S may form a slanted line on its top between sidewalls 232 and 234. Also as shown in FIG. 2A, recess 248 on an opposite end of the baseplate 230 has a base 246 of width W2 in the y-direction. Recess 248 has sidewalls 244 and 242 having respective thicknesses T1 and T2. As shown in FIG. 2A, T2 is greater than T1. In some implementations, W2 is between about 1 mm-5 mm.

Further shown in FIG. 2A is recess 258 which is between recesses 238 and 248. Recess 258 has a base of width W3 and sidewalls 234 and 244, which are shared with recesses 236 and 246, respectively. The sidewalls 234 and 244 both have thickness T1. In some implementations, the sidewalls of a recess closest to the perimeter of the baseplate (e.g., recesses 236 and 246) are not of equal thickness. In some implementations, the thickness of the sidewall closer to the perimeter of the baseplate is greater than the thickness of the sidewall further from the perimeter of the baseplate. A recess closest to the perimeter of the baseplate implies that there are no recesses between the recess and the perimeter. In some implementations, recesses that are not closest to the perimeter, i.e., there is at least one recess between the recess and the perimeter, have sidewalls of equal thicknesses.

As discussed previously, the sidewalls 232 and 234 act as a solder stop barrier to prevent outflow of solder during an attachment process with a substrate. As shown in FIG. 2A, the surface of the baseplate into which the set of recesses are cut is flat while the opposite surface, to which the pins 240 are attached, remains warped. Nevertheless, the warpage of the opposite surface of the baseplate 230 does not affect the outflow of solder from a solder joint because the surface into which the recesses are cut is flat in the recesses.

FIG. 3A is a diagram that illustrates a top view of an example single side direct cooling (SSDC) automotive power module package 300. SSDC automotive power module package 300 includes many semiconductor dies which are bonded to substrates which in turn are attached to baseplates.

In some implementations, substrates for such power modules include a layer of dielectric onto which a metal layer, e.g., copper is bonded; the metal layer is then patterned and a semiconductor die is disposed upon a portion of a patterned metal layer. Moreover, fabricating a substrate for power modules includes performing an etch operation on a metal layer disposed on a dielectric layer to produce a patterned metal layer onto which a semiconductor die may be soldered. In some implementations, the substrate is a direct bonded copper (DBC) substrate and the metal is copper. In some implementations, the metal includes aluminum.

In some applications, the voltages applied to a power module using a DBC substrate may be 100 V or higher. Such high voltages can cause large currents and, consequently, high temperatures. These high temperatures, which may be outside of the typical temperature range over which the DBC substrate operates, may cause structural problems with the DBC substrate. For example, the die structure and solder attach on a DBC surface have different coefficients of thermal expansion (CTEs). At the high temperatures induced by the high voltages seen in a power module, the above-described conventional approaches to fabricating a DBC substrate may result in cracks between the DBC and dielectric layer structure during assembly and test.

One technique to reduce stress in DBC substrates includes fabricating dimple-shaped holes into the copper layer. Such dimples are introduced as a form of a mold lock but were found to reduce stress cracking in the copper.

FIG. 3A shows a cross-section C through the SSDC package 300.

Figure 3C:
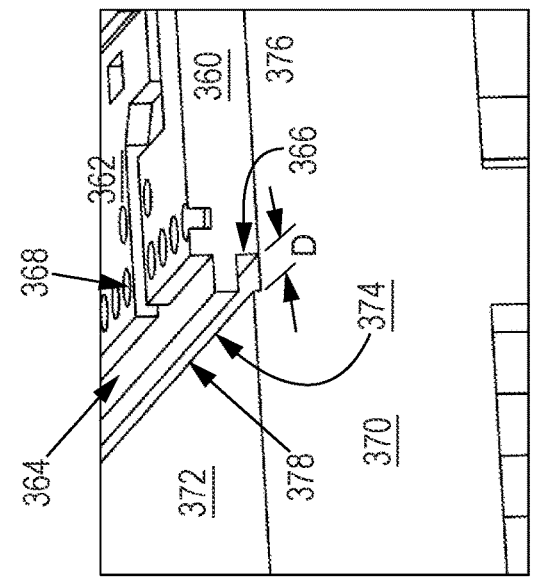
FIG. 3C is a diagram that illustrates a view along the cross-section of the example SSDC package with a substrate bonded to a baseplate.
Figure 3B:
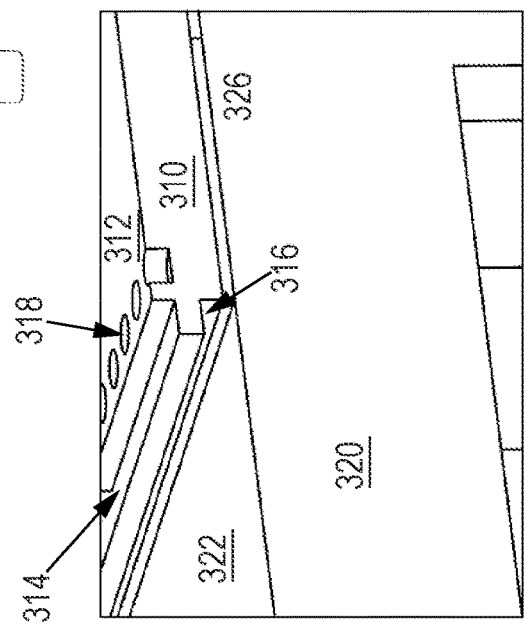
FIG. 3B is a diagram that illustrates a view along the cross-section of the example SSDC package with a substrate bonded to a baseplate.

FIG. 3B is a diagram that illustrates a view of an example semiconductor device package with a substrate 310 attached to a baseplate 320. As shown in FIG. 3B, the substrate 310 has a dielectric layer 314 onto which a first metal layer 312 is attached on a first surface and a second metal layer 316 is attached on a second surface.

In some implementations and as discussed previously, the first metal layer includes a set of dimple-shaped holes 318. Such dimple-shaped holes 318 have been found to reduce stress cracks in direct bonded metal (DBM) substrates.

The baseplate 320 is attached to the substrate 310 via a solder layer 326. Nevertheless, during the attach process, the baseplate 310 may undergo warpage on the surface 322. The warpage of surface 322 may cause solder from the solder layer 326 to outflow from between the substrate 310 and the baseplate 320 toward the center of the baseplate surface 322.

FIG. 3C is a diagram that illustrates a side and view of an improved semiconductor device package with a substrate 360 bonded to an improved baseplate 370, through the cross-section C. As shown in FIG. 3C, the substrate 360 has a dielectric layer 364 onto which a first metal layer 362 is attached on a first surface and a second metal layer 366 is attached on a second surface.

In some implementations and as discussed previously, the first metal layer includes a set of dimple-shaped holes 368. Such dimple-shaped holes 368 have been found to reduce stress cracks in direct bonded metal (DBM) substrates.

The baseplate 370 is attached to the substrate 360 via a solder layer 376. The baseplate 370 also has a recess 374 cut into the surface 372 of the baseplate 370. The sidewall 378 of recess 374 acts as a barrier to solder outflow from solder layer 376 during the attach process.

Moreover, the substrate 310 is attached to the baseplate 370 in the recess 374, at a recess base (not shown). When the metal on the surface of the recess base is copper, there is an increased surface energy relative to nickel. This implies that the surface 372 has a higher surface energy than the surface 322 because the surface 322 includes nickel plated over the baseplate 320.

As shown in FIG. 3C, the width of the recess 374 between the sidewall 378 and the second metal layer 366 is D. In some implementations, D is between 0.1 mm and 1.0 mm. Also as shown in FIG. 3C, the dielectric layer 364 of the substrate 360 protrudes from the first and second metal layers 362 and 366, respectively, of the substrate 360 and is accordingly disposed apart, e.g., above, the recess 374 and sidewall 378. In some implementations, the sidewall 378 is located underneath the dielectric layer 364 of the substrate 360. In some implementations, as illustrated in FIG. 3C, the sidewall 378 is located or aligned along the edge of the dielectric layer 364; that is, the edge of the dielectric layer 364 and the sidewall 378 are at the same position along the baseplate. In some implementations, the sidewall 378 is located outside of an edge of the dielectric layer 364.

Figure 4A:
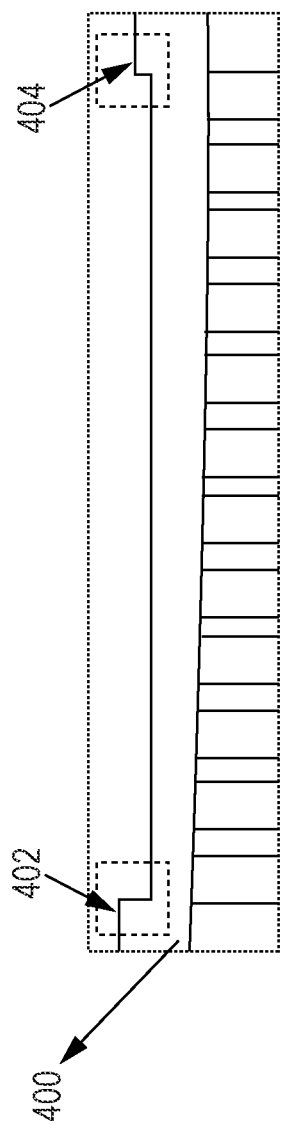
FIG. 4A is a diagram that illustrates a side view of an example baseplate recess with pinfins, having a recess that forms a flat surface.

FIG. 4A includes a diagram that illustrates a side view of an example baseplate 400 with pins, having a recess that forms a flat surface in its base. The recess has sidewalls 402 and 404; sidewall 402 has a greater thickness than sidewall 404 with respect to the recess base. The surface of the baseplate 400 opposite the recess has warpage and deviates from a flat surface by an amount D. In some implementations, D may be between 0.01 mm-1.5 mm. In some implementations, D is about 0.9 mm.

Figure 4B:
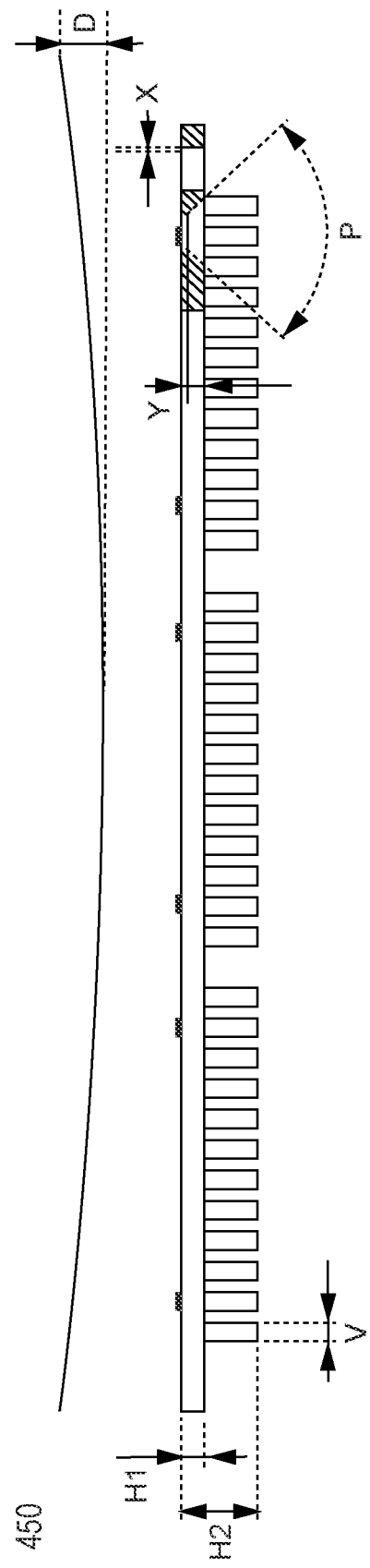
FIG. 4B is a diagram that illustrates a side view of an example baseplate with pinfins.

FIG. 4B is a diagram that illustrates a side view of an example baseplate 450 with pins and a set of recesses. As shown in FIG. 4B, the baseplate 450 has a thickness H1 without pins and thickness H2 with pins. Each pin as shown on baseplate 450 has a width V, although in some implementations, the pins on a baseplate may have varying widths. In some implementations, V is between about 0.5 mm-2.5 mm.

FIG. 4B also shows the recesses on the surface of the baseplate 450. The recess has a depth below a bottom of a sidewall Y; in some implementations, Y is about 0.2 mm. The baseplate 450 also has screw mounting holes for the baseplate housing and mounting to the water cooling jacket. The values of X and P are about 0.20×45 degrees and about 90 degrees.

Figures 5A, 5B:
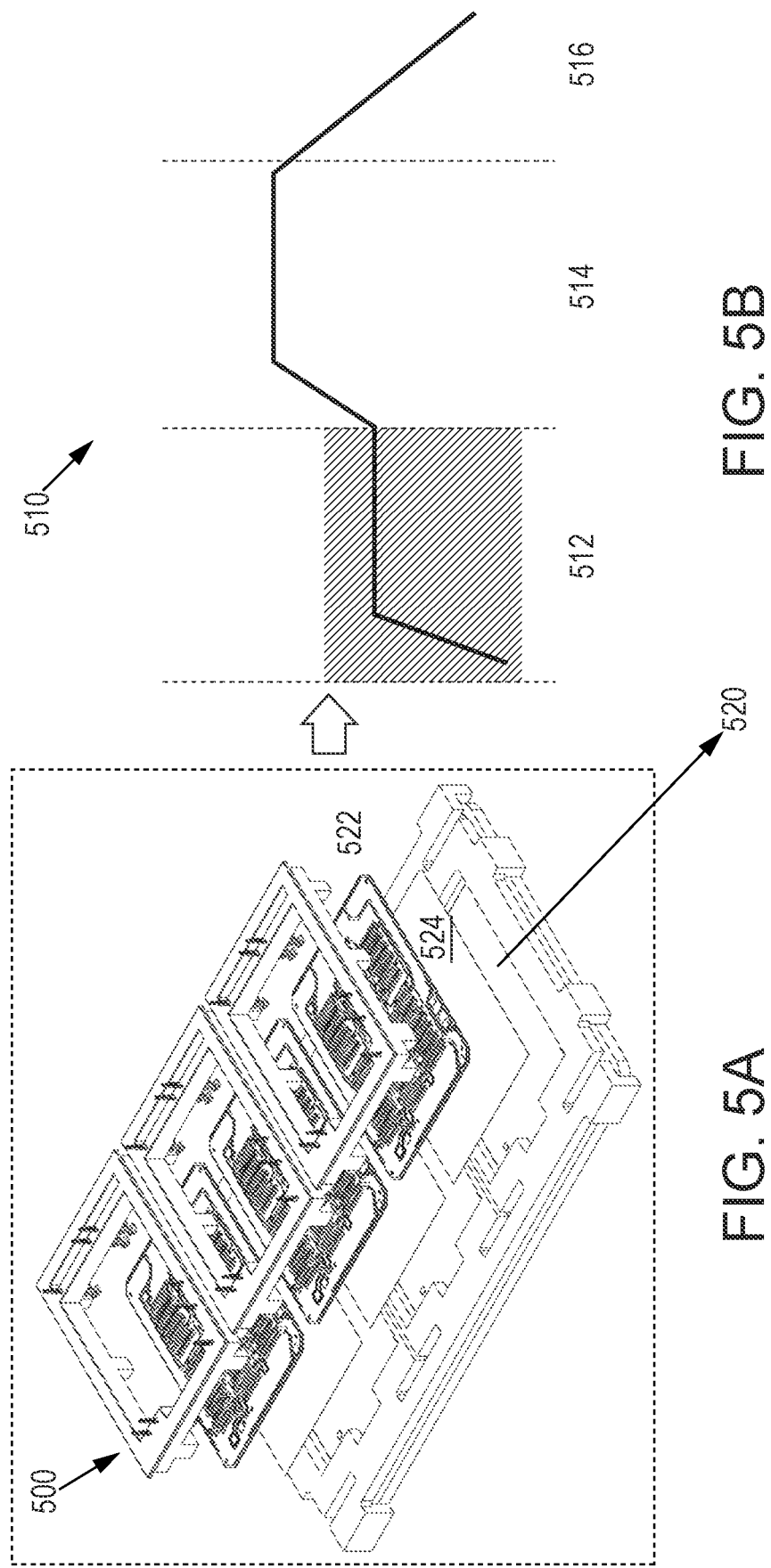
FIG. 5A is a diagram that illustrates a direct bonded copper (DBC) substrate being coupled to a baseplate using an example attach process.
FIG. 5B is a diagram that illustrates a graph of baseplate surface temperature in a DBC-to-baseplate attach process.

FIG. 5A is a diagram that illustrates an exploded view of a single side direct cooling (SSDC) automotive power module package 500. Package 500 illustrates an attachment of direct bonded copper (DBC) substrates 522 to a baseplate 520 via solder layers 524. The baseplate 520 as shown in FIG. 5A has a set of recesses as described above to which the substrates 522 are attached via solder layers 524.

FIG. 5B is a diagram that illustrates a graph 510 of baseplate surface temperature vs. time or attach process progress during a DBC to baseplate attach process. As shown in FIG. 5B, the solder attach process graph 510 is split into three subprocesses: cleaning in a first chamber 512, reflow in a second chamber 514, and cooling in a third chamber 516.

The cleaning stage 512 begins at a baseline temperature which rises as oxides are removed from the baseplate 520 until the chamber reaches a specified temperature. In some implementations, this removal may be performed with a formic acid cleaning within the set of recesses. When the recess base has a copper surface, the copper oxide is more easily removed that a nickel oxide layer on a baseplate without recesses. Moreover, the copper surface allows for the cleaning stage 512 to be performed at a lower temperature than that for a nickel surface.

The reflow stage 514 begins at the threshold temperature of stage 512 and rises to a second specified temperature. In the reflow stage, the solder layer 524 is applied between surfaces of the baseplate 520 and the substrates 522 at the baseplate recesses. The reflow stage 514 is performed in a vacuum chamber. The cooling stage 516 is performed in a cooling chamber and allows the solder in the solder layer 524 to harden, completing the attachment process. The benefit of the solder attach process described by the graph 510 is that an exposure of the first metal level can ease the cleaning stage 512 when formic acid is used.

FIG. 6 is a flow chart that illustrates an example method for fabricating a substrate in a semiconductor device package according to improved techniques.

At 602, a cutting operation is performed on a surface of a baseplate to produce a set of recesses cut out of the first surface of the baseplate. Each of the set of recesses includes a respective recess base, a respective first sidewall, and a respective second sidewall. The respective first sidewall has a first thickness above the respective recess base and the respective second sidewall has a second thickness above the respective recess base.

At 604, a substrate is received. The substrate includes a dielectric layer, a first metal layer disposed on a first surface of the dielectric layer, and a second metal layer disposed on a second surface of the dielectric layer.

At 606, the substrate is attached to the surface of the baseplate at a recess base of a recess of the set of recesses via a solder layer.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or subcombinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method for a semiconductor package comprising:
    performing a material removal operation on a baseplate at a region of a surface of the baseplate to produce a recess in the baseplate, the recess including a recess base, a first sidewall, and a second sidewall;
    receiving a substrate, the substrate including:
        a dielectric layer;
        a first metal layer disposed on a first surface of the dielectric layer; and
        a second metal layer disposed on a second surface of the dielectric layer; and
    attaching the substrate to a surface of the recess base of the recess via a conductive-bonding component, the surface of the recess base being contiguous with the first sidewall.

2. The method as in claim 1, wherein the baseplate includes a first metal and is plated at the surface of the baseplate with a second metal.

3. The method as in claim 2, wherein performing the material removal operation includes:
    polishing the second metal by which the surface of the baseplate is plated to reveal the first metal in the recess.

4. The method as in claim 2, wherein attaching the substrate includes:
    cleaning the baseplate with formic acid in the recess base of the recess; and
    applying the conductive-bonding component to the recess base and the second metal layer of the substrate.

5. The method as in claim 2, wherein the surface of the recess base includes a surface of the second metal.

6. The method as in claim 2, wherein a surface of the recess base includes a set of protruding dimples.

7. The method as in claim 1, wherein the first sidewall has a first thickness above the recess base and the second sidewall has a second thickness above the recess base, the second thickness being greater than the first thickness.

8. The method as in claim 7, wherein a difference between the second thickness and the first thickness is greater than about 0.1 mm.

9. The method as in claim 7, wherein the first thickness is about 0.1 mm.

10. The method as in claim 1, wherein a width of the recess base of the recess is greater than a width of the substrate at the second metal layer.

11. A method, comprising:
    performing a material removal operation on a baseplate at a region of a surface of the baseplate to produce a recess in the baseplate, the recess including a recess base, a first sidewall, and a second sidewall;
    receiving a substrate, the substrate including:
        a dielectric layer;
        a first metal layer disposed on a first surface of the dielectric layer; and
        a second metal layer disposed on a second surface of the dielectric layer; and
    attaching the substrate to the baseplate at a surface of the recess base of the recess, the surface of the recess base being adjacent to the first sidewall.

12. The method as in claim 11, wherein the baseplate includes a first metal and is plated at the surface of the baseplate with a second metal.

13. The method as in claim 12, wherein performing the material removal operation includes:
    polishing the second metal by which the surface of the baseplate is plated to reveal the first metal in the recess.

14. The method as in claim 12, wherein attaching the substrate includes:
    cleaning the baseplate with formic acid in the recess base of the recess; and
    applying a conductive-bonding component to the recess base and the second metal layer of the substrate.

15. The method as in claim 12, wherein the surface of the recess base includes a surface of the second metal.

16. The method as in claim 12, wherein a surface of the recess base includes a set of protruding dimples.

17. The method as in claim 11, wherein the first sidewall has a first thickness above the recess base and the second sidewall has a second thickness above the recess base, the second thickness being greater than the first thickness.

18. The method as in claim 17, wherein a difference between the second thickness and the first thickness is greater than about 0.1 mm.

19. The method as in claim 17, wherein the first thickness is about 0.1 mm.

20. The method as in claim 11, wherein a width of the recess base of the recess is greater than a width of the substrate at the second metal layer.

21. A method, comprising:
    forming a recess in a baseplate at a surface of the baseplate, the recess including a recess base, a first sidewall, and a second sidewall;
    receiving a substrate, the substrate including:
        a dielectric layer;
        a first metal layer disposed on a first surface of the dielectric layer; and
        a second metal layer disposed on a second surface of the dielectric layer; and
    attaching the substrate to a surface of the recess base of the recess via a conductive-bonding component, the surface of the recess base being contiguous with the first sidewall.

22. The method as in claim 21, wherein the baseplate includes a first metal and is plated at the surface of the baseplate with a second metal.

* * * * *